(12) United States Patent
Baur et al.

(10) Patent No.: US 6,180,875 B1
(45) Date of Patent: Jan. 30, 2001

(54) HOUSING

(75) Inventors: Richard Baur, Pfaffenhofen; Günter Fendt, Schrobenhausen; Engelbert Wörle, Kühbach, all of (DE)

(73) Assignee: Temic Telefunken microelectronic GmbH, Heilbronn (DE)

( * ) Notice: Under 35 U.S.C. 154(b), the term of this patent shall be extended for 0 days.

(21) Appl. No.: 09/202,446

(22) PCT Filed: Apr. 15, 1998

(86) PCT No.: PCT/EP98/02212

§ 371 Date: Jun. 21, 1999

§ 102(e) Date: Jun. 21, 1999

(87) PCT Pub. No.: WO98/46458

PCT Pub. Date: Oct. 22, 1998

(30) Foreign Application Priority Data

Apr. 15, 1997 (DE) .............................. 197 15 573

(51) Int. Cl.⁷ ...................................... H05K 5/00
(52) U.S. Cl. ................. 174/17 GF; 174/17 CT; 174/50.5
(58) Field of Search ............ 174/50, 50.5, 17.05, 174/17.06, 17 GF, 17 VA, 17 CT

(56) References Cited

FOREIGN PATENT DOCUMENTS

| | | |
|---|---|---|
| 2718563 * | 11/1978 | (DE) . |
| 3107694 * | 9/1982 | (DE) . |
| 39 05 835 | 8/1990 | (DE) . |
| 91 05 335 | 8/1991 | (DE) . |
| 4329980 * | 10/1994 | (DE) . |
| 43 29 055 | 3/1995 | (DE) . |
| 19505125 * | 8/1995 | (DE) . |
| 44 47 513 | 2/1996 | (DE) . |
| 197 08 116 | 9/1998 | (DE) . |
| 0 248 181 | 12/1987 | (EP) . |
| WO 84 01082 | 3/1984 | (WO) . |

\* cited by examiner

*Primary Examiner*—Dean A. Reichard
(74) *Attorney, Agent, or Firm*—Venable; George H. Spencer; Robert Kinberg

(57) ABSTRACT

The invention relates to a housing for an electric or an electronic component, in particular a motor vehicle control unit, for which the housing parts or housing connections are designed such that the electric or electronic components are sealed watertight and airtight. Such housings, which are composed if only in part of a thermoplastic synthetic material, are provided with a pressure compensation feature. As a result, the pressure inside the housing is constantly adapted to the outside pressure. With this type of pressure adaptation, it is not possible for gases, particularly water vapor, to permeate the synthetic housing under pressure and reach the electric or electronic components. As a result, damage caused by humidity is greatly reduced and the service life is increased.

7 Claims, 2 Drawing Sheets

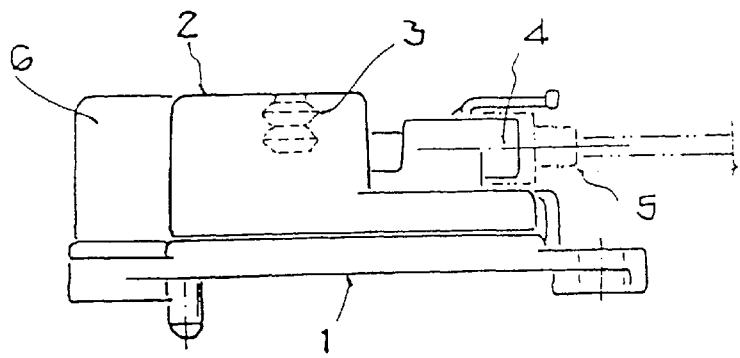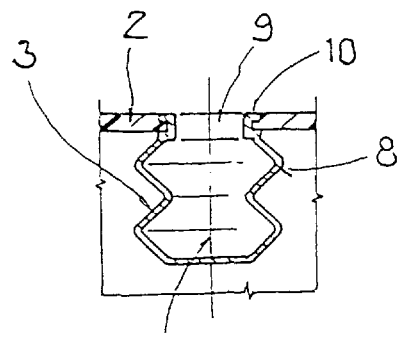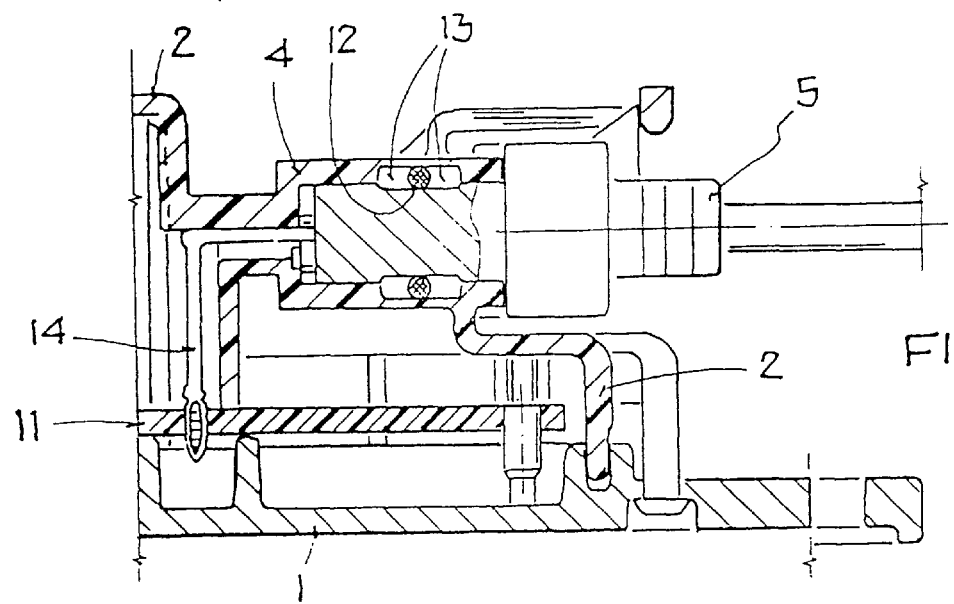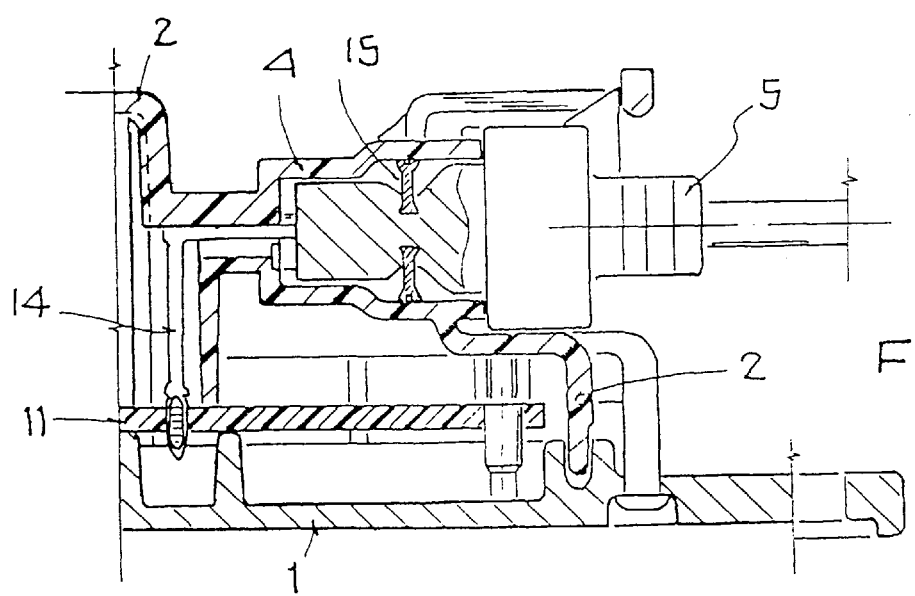

HOUSING

BACKGROUND OF THE INVENTION

The invention relates to a housing for an electric or electronic component, in particular a motor vehicle control unit, including a one-part or multi-part container and one or more one-part or multi-part sealing devices.

Electric and electronic components, in particular electronic control units, as a rule are mounted inside a housing to protect them against environmental influences, such as mechanical effects, dust, and humidity. If the housing is used in a motor vehicle, these requirements are particularly high. Housings of this type must protect the sensitive electronic components from moisture, which can enter the housing in liquid form as water or in gaseous form as water vapor. As a rule, the housings are made at least in part of a thermoplastic synthetic material. These synthetic parts are watertight, but not gas-tight, so that water in a gaseous form can penetrate. If a multi-part housing is sealed watertight with corresponding seals, no liquid can penetrate, but gas can reach the inside of the housing. The following applies in that case:

$$Q = P * \frac{A * t}{d}$$

Q: Amount of gas penetrating in cm³ or amount of water vapor in g
A: Surface in cm²
t: Effective time in days
d: Wall thickness in cm
P: Permeation constant in cm²/t (gas) or g/(cm*t) (water vapor)[1]

However, if the pressure outside of the housing differs from the pressure on the inside of the housing, which is generated above all by the temperature difference between the inside of the housing and the outside of the housing, air can reach the inside of the housing. The following applies in that case:

$$Q = P * \frac{A * t * \delta p}{d}$$

Q: Amount of gas penetrating in cm³ or amount of water vapor in g
A: Surface in cm²
t: Effective time in days
$\delta p$: Difference in pressure in cm mercury column
d: Wall thickness in cm
P: Permeation constant in cm²/t (gas) or g/(cm²*t) (water vapor)

However, the air also contains gaseous water vapor, which penetrates the synthetic material and enters the housing because of its smaller particle size and owing to the pressure difference. Given the following parameters, a non-negligible amount of water can accumulate in the housing in the motor vehicle region. This is true for a relative humidity level of 85% on the outside and 0% relative humidity on the inside and a temperature of 20° C. and 1 bar air pressure.

P=2.1 10⁻⁶ g/(cm²t) for polybutylene terephthalate
A=32 cm²
d=1.5 mm
t=15 years=5475 days wherein:

10% operating time (547.5 days) at 20° C.   no pressure difference
20% operating time (1095 days) at 40° C.   $\delta p$ = 0.068 bar = 5.17 cm
50% operating time (2737.5 days) at 60° C.   $\delta p$ = 0.137 bar = 10.41 cm
20% operating time (1095 days) at 80° C.   $\delta p$ = 0.2 bar = 15.2 cm $Q_{total} = Q_{20° C.} + Q_{40° C.} ++ Q_{60° C.} + Q_{60° C.} = 0.25$ g + 2.5 g + 12.8 g + 7.5 g = 23 g It means that over the total service life of a motor vehicle, in the worst case 23 g water enter through a synthetic housing part with a surface of 32 cm² and a thickness of 1.5 mm. The condensed water can do considerable damage to the electronic components. For example, it changes the conductivity between the various components, which can lead to short-circuits and causes oxidation, meaning rusting, of contacts. For those reasons, housings were provided until now with so-called pressure-equalizing openings, where a pressure compensation can occur between the housing inside and the environment. To prevent water from entering at the openings in the housing, these were closed off with a watertight and breathable foil, e.g. as known under the name Goretex or Sympatex, so that the electronic circuit is protected against water damage and moisture damage. This state of the technology is reflected in the German Patent Application No. 197 08 116.9.

It is disadvantageous in this case that an additional operational step is required for closing off the pressure-compensation openings with the watertight and breathable foil. Such watertight and breathable foils are very expensive. Furthermore, it is a disadvantage of such foils that they reduce the diffusion rate as a result of the pressure compensation, to be sure, but are also water vapor permeable.

SUMMARY OF THE INVENTION

Thus, it is the object of the invention to create a housing of the aforementioned type, which does not have the previously listed disadvantages and which protects an electronic or electric component reliably against environmental influences.

This object is solved according to the invention. Closing off the container to be watertight with a movable sealing device inside or on the container to change the inside volume by permitting movement between the container and the sealing device or by having the container or the sealing device be fully or partially expendable. The basic idea behind the invention is that the inside volume of the housing is variable, depending on the pressure conditions, thus resulting in pressure compensation. Less moisture reaches the inside of the housing as a result of this pressure adaptation, which is achieved through an increase or decrease of the housing inside volume. Owing to this pressure adaptation, less water vapor can permeate the synthetic material and reach the inside of the housing. The changeable housing inside volume can be realized in two different ways. One option provides for a mutual displacement of the housing parts. The other option provides that at least a portion of the housing is expandable.

The advantages achieved with the invention are that no liquid and no gas enter this housing as a result of pressure differences. The electric and electronic components are protected reliably inside the housing against damaging environmental influences. At the same time, the life expectancy of components in such housings is increased strongly. Based on the previous calculations, only 2.5 g instead of 23 g of water would then enter the housing.

Advantageous modifications of the invention are possible. For example, a so-called pressure compensation element may be provided on one housing part. This pressure compensation element is movable and changes its size and thus the inside volume of the housing in dependence on the pressure conditions. Another advantageous modification of the invention consists in that an adhesive connection or a seal is elastic, as a result of which the housing parts can be mutually displaced and the housing volume can thus be changed. The same effect, namely a variable housing inside volume, is achieved in that a plug, which closes off the housing, is attached movably in a plug-in device in the housing, so that it can be moved back and forth.

Several exemplary embodiments of the invention are to be illustrated with the aid of FIGS. 1 to 5.

BRIEF DESCRIPTION OF THE DRAWINGS

FIG. 1a is a side view of a housing with pressure compensation element;

FIG. 1b is a sectional view of a pressure compensation element;

FIG. 2 is a sectional view of a housing with movable insulating ring;

FIG. 3 is a sectional view of a housing with movable insulating sealing lip;

DETAILED DESCRIPTION OF THE PREFERRED EMBODIMENTS

Figure 4A:
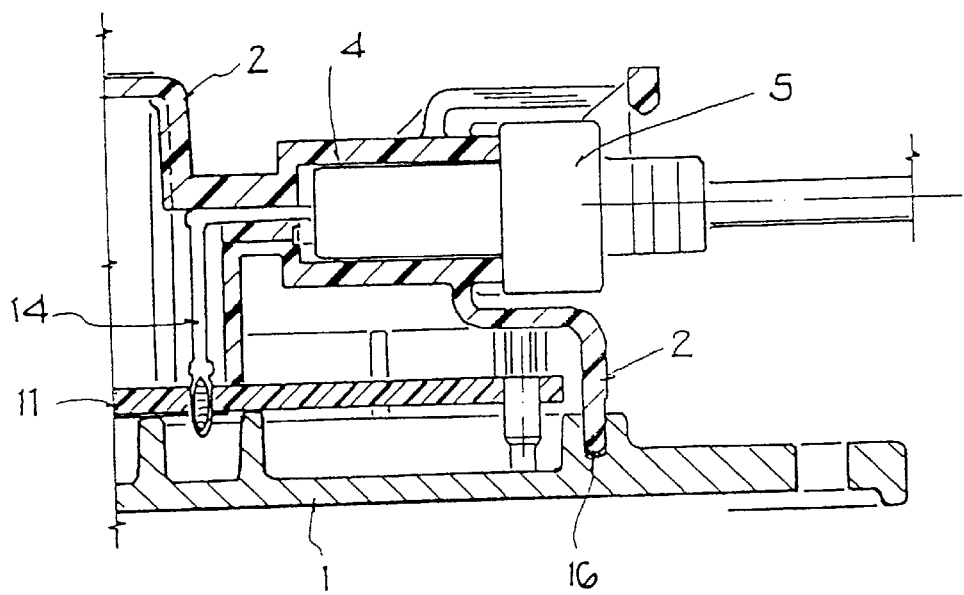
FIG. 4a is a sectional view of a housing with elastic adhesive or sealing material.

FIG. 1a shows a view from the side of a housing 6 with pressure compensation element 3. On the one hand, the housing 6 consists of a thermoplastic synthetic container 2, e.g. made of polybutylene terephthalate (PBT). This synthetic material is impermeable to liquids, especially water, but can be penetrated by gaseous materials. The solution diffusion progresses in three stages. First, the diffusing material is absorbed at the side surface with the higher material concentration. Subsequently, the material to be absorbed moves within the synthetic material from the side with the higher concentration in the direction of the side with the lower concentration. Finally, the material absorbed by the synthetic material is deposited on the side with the lower material concentration. The solution diffusion depends on the pressure conditions between inside wall and outside wall, as previously described.

Furthermore, this housing 6 comprises a bottom 1 that closes off the synthetic container 2 on the bottom. This bottom 1 can be made of metal or a synthetic material. The container 2 also comprises a plug-in device 4 that is open in the contact region, said location being closed off with the aid of a plug 5. A pressure compensation element 3 is furthermore mounted on the container, the size and form of which can change in dependence on the prevailing pressure differences. The pressure compensation element 3 is designed to resemble an accordian, as shown in the detailed view of the pressure compensation element 3 in FIG. 1a. Said pressure compensation element 3 consists of a rubber-type material 8 and closes off an opening 9 in the container 2 with the aid of a closing part 10. The pressure compensation element 3 furthermore projects toward the inside of the container 2 where it requires more or less space, depending on its inherent volume 7. The inherent volume 7 depends on the pressure conditions because the shape changes due to forces acting upon it as a result of the accordian like structure, that is by expanding or contracting. With such a pressure compensation element, it does not matter whether it projects toward the inside of the housing or away from the housing outside and on which part of the housing it is mounted. It is only important that it changes the inside volume of the housing by changing its own shape. The shape of the pressure compensation element really is not important. The pressure compensation element can also be embodied as a balloon that changes its shape depending on the pressure.

Figure 4B:
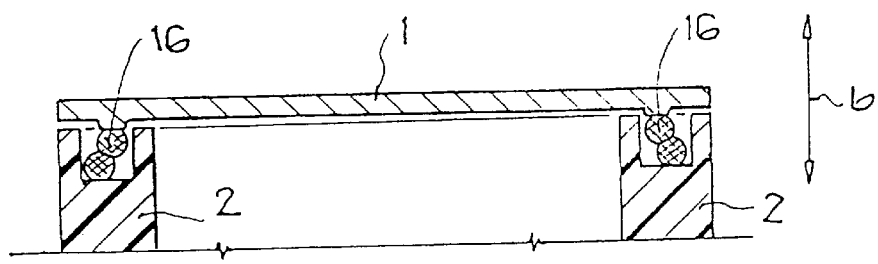
FIG. 4b is a simplified sectional view of a housing with elastic adhesive or sealing material.

FIG. 2 illustrates another exemplary embodiment. Shown is a section through the housing, which has a movable insulating ring 12 in the plug-in region 4. The housing for this embodiment also consists of a container 2 with a plug-in device 4. The electronic components to be protected are inside the container, on a circuit board 11. These electronic components are connected via contact pins 14 with the plug 5. The container is closed off from below with a bottom 1 and is sealed with a plug 5, which seals the container 2 in the plug-in device 4. The sealing ring 12 makes it possible for the plug 5 to be moved back and forth inside the plug-in device 4 and, at the same time, provide a water-tight or gas-tight seal for the housing, depending on the material. The sealing ring 12 can be mounted fixedly in the plug-in device 4 as well on at the plug 5 or can be positioned movably in a guide 13, as illustrated. It is only important for this exemplary embodiment that the plug 5 or another seal is movable inside the plug-in device 4 or another sealing device, without loss of the sealing effect toward the outside. It is furthermore important that the housing inside volume is changeable by moving the plug 5 back and forth and that this back and forth movement is controlled by the pressure difference, so that a pressure compensation between the housing inside and the environment can occur. The exemplary embodiment shown in FIG. 3 is also based on this principle, wherein a movable sealing lip 15 ensures that the plug 5 is movable inside the plug-in device 4. It makes sense if this sealing lip is attached to the plug-in device or the plug. The lip furthermore is wide enough and elastic enough so that it fits flush against the inside wall of the plug-in device during a plug movement, thereby reliably sealing the housing at that location. Rubber-type materials are preferred for the sealing lip and the sealing ring. Another embodiment, which permits compensating the pressure by adapting the inside volume of the housing, is shown in FIGS. 4a and 4b. FIG. 4a also shows the housing, for which the container holds the electronic components to be protected and is closed off by a bottom plate 1 and the plug 5. In this case, the device effecting the adaptation of the volume inside the housing to the existing pressure conditions consists of an elastic adhesive or an elastic sealing mass 16 between bottom 1 and container 2. This adhesive or this sealing mass is expandable and tough and adheres to the bottom 1 and the container 2, even if force is applied, so that the movable sealing device is also reliably impenetrable. These facts are also illustrated in FIG. 4. An up and down movement of the bottom 1, a lid or any other closing device or the container 2 is possible in the direction of the arrow as a result of the elastic adhesive or the elastic sealing mass 16. In the process, the inside volume changes until the pressure is compensated.

Figure 5A:
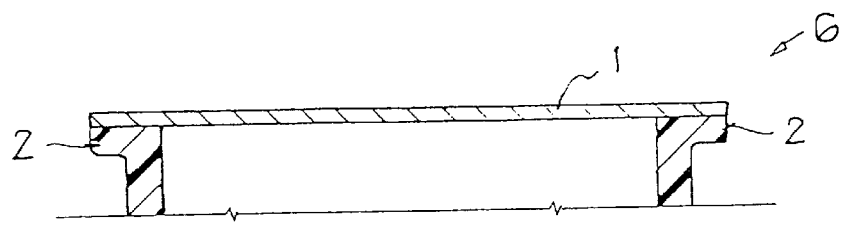
FIG. 5a is a sectional view of a housing with deformable housing part, having identical inside pressure and outside pressure.
Figure 5B:
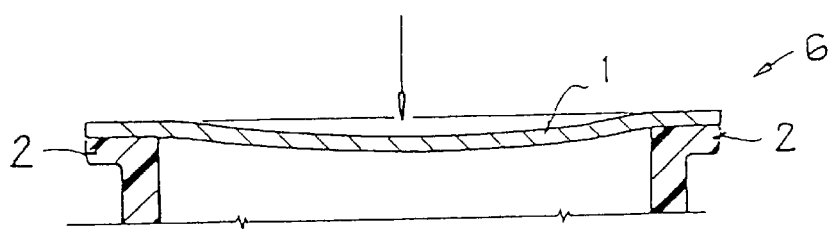
FIG. 5b is a sectional view of a housing with deformable housing part and negative pressure inside the housing.
Figure 5C:
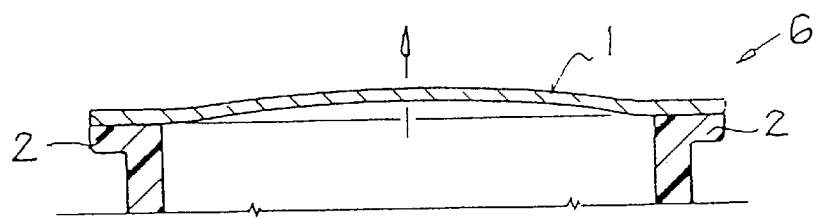
FIG. 5c is a sectional view of a housing with deformable housing part and excess pressure inside the housing.

The exemplary embodiments shown in FIGS. 5a, 5b and 5c illustrate another option for achieving a pressure compensation through volume adaptation inside the housing. The housing shown therein has at least one housing part or a seal that is expandable. FIG. 5a illustrates the balanced state where the temperature and the pressure inside the housing are the same as the environmental conditions outside of the housing 6 and there is no force acting upon the lid 1. If the temperature drops inside the housing or if the temperature rises outside of the housing, then a low pressure develops, the expandable housing part 1 is deformed toward the inside and reduces the inside volume until the pressure is equalized once more. On the other hand, if the temperature rises inside the housing or the temperature drops outside of the housing, then an excess pressure develops and the expandable housing part 1 is deformed toward the outside, that is until the volume is high enough for the inside pressure and the outside pressure of the housing 6 to remain constant.

What is claimed is:

1. A housing having a single variable inside volume for an electric or electronic component, comprising:

a one-part or multi-part container;

at least one one-part sealing device; and sealing means for closing off the container in a watertight manner, wherein the container, the sealing means and the at least one sealing device together define the single variable inside volume and wherein at least one of the container and the at least one sealing device is expandable to change the single variable inside volume of the housing.

2. A housing according to claim 1, wherein at least one of the container and the at least one sealing device has an expandable pressure compensation element which increases or reduces the single variable inside volume of the housing depending on the pressure difference between an area inside the housing and an area surrounding the housing.

3. A housing according to claim 1, wherein the component is a motor vehicle control unit.

4. A housing having a single variable inside volume for an electric or electronic component, comprising:

a one-part container;

at least one one-part or multi-part sealing device; and sealing means for closing off the container in a watertight manner;

wherein the container, the sealing means and the at least one sealing device together define the single variable inside volume and the at least one sealing device is movable relative to the container to change the single variable inside volume of the housing, via a back and forth movement between the container and the at least one sealing device.

5. A housing according to claim 1, wherein the component is a motor vehicle control unit.

6. A housing according to claim 1, wherein at least one movable connection between the container and the at least one sealing device is provided by an elastic adhesive or an elastic sealing mass, to permit relative movement between the at least one sealing device and the container to change the single variable inside volume of the housing.

7. A housing according to claim 6, wherein the at least one sealing device comprises a plug which can be moved back and forth inside a plug-in device.

* * * * *